United States Patent
Itoh

(10) Patent No.: US 6,853,600 B2
(45) Date of Patent: Feb. 8, 2005

(54) FERRO-ELECTRIC RANDOM ACCESS MEMORY USING PARAELECTRIC AND FERROELECTRIC CAPACITOR FOR GENERATING A REFERENCE POTENTIAL

(75) Inventor: Yasuo Itoh, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/684,497

(22) Filed: Oct. 15, 2003

(65) Prior Publication Data

US 2004/0130928 A1 Jul. 8, 2004

(30) Foreign Application Priority Data

Oct. 15, 2002 (JP) ........................................ 2002-300522

(51) Int. Cl.[7] ................................................ G11C 7/02
(52) U.S. Cl. ...................... 365/210; 365/209; 365/207; 365/145; 365/213; 365/211; 365/190; 365/205; 365/51; 365/203
(58) Field of Search ................................. 365/145, 210, 365/208, 209, 207, 212, 213, 211, 190, 205, 51, 203

(56) References Cited

U.S. PATENT DOCUMENTS 5,768,176 A * 6/1998 Katoh ........................ 365/145
5,940,316 A  8/1999 Koike ........................ 365/145
6,363,002 B1 * 3/2002 Nishimura et al. ......... 365/145
6,594,174 B2 * 7/2003 Choi et al. .................. 365/145

FOREIGN PATENT DOCUMENTS

| JP | 9-134594 | 5/1997 | ........... G11C/14/00 |
| JP | 11-16377 | 1/1999 | ......... G11C/14/100 |

* cited by examiner

*Primary Examiner*—Andrew Q. Tran
(74) *Attorney, Agent, or Firm*—Oblon, Spivak, McClelland, Maier & Neustadt, P.C.

(57) ABSTRACT

A dummy cell (reference electric potential generating circuit) DC has a paraelectric capacitor DCC1 and a ferro-electric capacitor DCC2. One end of the paraelectric capacitor DCC1 and one end of the ferro-electric capacitor DCC2 are commonly connected to a node N1. A dummy plate electric potential DPL1 is supplied to the other end of the paraelectric capacitor DCC1, and a dummy plate electric potential DPL2 is supplied to the other end of the ferro-electric capacitor DCC2. When data of a memory cell MC is read at a bit line (selective bit line) BL1, a reference electric potential is supplied to a bit line (reference bit line) BL2 from the dummy cell DC.

17 Claims, 3 Drawing Sheets

FERRO-ELECTRIC RANDOM ACCESS MEMORY USING PARAELECTRIC AND FERROELECTRIC CAPACITOR FOR GENERATING A REFERENCE POTENTIAL

CROSS-REFERENCE TO RELATED APPLICATIONS

This application is based upon and claims the benefit of priority from the prior Japanese Patent Application No. 2002-300522, filed Oct. 15, 2002, the entire contents of which are incorporated herein by reference.

BACKGROUND OF THE INVENTION

1. Field of the Invention

The present invention relates to a reference electric potential generating circuit of a ferro-electric random access memory, and in particular, is used for a ferro-electric random access memory structured from a one-transistor and one-capacitor (1T1C) type memory cell which is suitable for high-integration.

2. Description of the Related Art

The ferro-electric random access memory has the features that it stores data in a nonvolatile manner, and that the reading/writing speed thereof is as high-speed as that of DRAMs and SRAMs, and it is one of the memories which is currently being most noticed.

With respect to DRAMs, currently, products having memory capacities of 128 megabits to 512 megabits are being merchandised. However, with respect to ferro-electric random access memories, the history thereof is not long, and merely the development of products having a memory capacity of 32 megabits has been announced at academic conference.

With respect to ferro-electric random access memories as well, it is thought that the increasing of the memory capacity thereof will progress from now on. However, what is problematic here is reducing the cell surface area.

In a conventional ferro-electric random access memory, in order to achieve a stable operation, a two-transistor and two-capacitor (2T2C) type memory cell is used. The 2T2C type memory cell is a memory cell of a type in which 1 bit data is stored by using two transistors and two capacitors.

It can be said that the 2T2C type memory cell is a memory cell in which 1 bit data is stored by using two of the 1T1C type memory cells. In this case, the data stored in one of the 1T1C type memory cells and the data stored in the other 1T1C type memory cell are set so as to have values which are opposite to one another. Further, because the data reading is carried out due to both of the data being compared with one another, a stable reading is possible.

However, in the 2T2C type memory cell, because the number of elements required for storing 1 bit data is large, the surface area on a chip required for 1 bit is large of necessity, and the 2T2C type memory cell is not suitable for increasing memory capacity.

Then, currently, mainly, the development of ferro-electric random access memories using 1T1C type memory cells has been carried out. The 1T1C type memory cell is a memory cell of a type in which 1 bit data is stored by using one transistor and one capacitor, and because the data reading is carried out by comparison between an electric potential of reading of the memory cell and a reference electric potential, the 1T1C type memory cell is suitable for achieving increasing memory capacity.

These are described in the following documents.
Document 1:
ISSC94/SESSION 16/TECHNOLOGY DIRECTIONS: MEMORY, PACKAGING/PAPER FA 16.2: A 256 kb Nonvolatile Ferroelectric Memory at 3V and 100 ns: Sumi et al.
Document 2:
IEEE JOURNAL OF SOLID-STATE CIRCUITS, VOL. 32, No. 5, MAY 1997: 2-V/100-ns 1T/1C Nonvolatile Ferroelectric Memory Architecture with Bitline-Driven Read Scheme and Nonrelaxation Reference Cell: Hirano et al.

FIG. 1 shows an example of a cell array portion of the conventional ferro-electric random access memory structured from a 1T1C type memory cell.

A memory cell MC and a dummy cell DC are disposed in a cell array portion CA.

The memory cell MC is structured from a selective transistor ST and a ferro-electric capacitor CC. The selective transistor ST and the ferro-electric capacitor CC are connected in series. One end of the selective transistor ST is connected to a bit line BL1, and a plate electric potential VPL is supplied to one end of the ferro-electric capacitor CC. A gate of the selective transistor ST is connected to a word line WL.

At the time of the reading operation, when the word line WL is selected, a pressurizing electric potential VPP, for example, about 4V is supplied to the word line WL. The plate electric potential VPL at this time is set to, for example, about 2.5V.

The dummy cell DC is structured from selective transistors DT1 and DT2, a reset transistor RST, and a paraelectric capacitor DCC. The selective transistor DT1 is connected between the bit line BL1 and one end of the paraelectric capacitor DCC, and the selective transistor DT2 is connected between the bit line BL2 and the one end of the paraelectric capacitor DCC.

The gate of the selective transistor DT1 is connected to a dummy word line bDWL, and the gate of the selective transistor DT2 is connected to a dummy word line DWL. One end of the reset transistor RST is connected to the one end of the paraelectric capacitor DCC, and an earthing electric potential Vss is supplied to the other end of the reset transistor RST. The turning-on/turning-off of the reset transistor RST is controlled by a control signal BDRST. A dummy plate electric potential DPL is supplied to the other end of the paraelectric capacitor DCC.

Here, for example, when data of the memory cell MC is read at the bit line BL1, a reference electric potential generated by the dummy cell DC is supplied to the bit line BL2. Namely, an electric potential at the one end of the paraelectric capacitor DCC is risen to a predetermined value by coupling with the dummy plate electric potential (an electric potential at the other end of the paraelectric capacitor DCC, for example, about 1.5V) DPL. Further, the dummy word line DWL becomes "H", and the dummy word line bDWL becomes "L".

A sense amplifier SA is connected between the bit lines BL1 and BL2. The sense amplifier SA has a P channel sense amplifier formed from two P channel MOS transistors QP1 and QP2, and an N channel sense amplifier formed from two N channel MOS transistors QN1 and QN2. The P channel sense amplifier is controlled by a control signal BSEP, the N channel sense amplifier is controlled by a control signal SEN.

An operating electric potential VAA of the sense amplifier SA is usually set to the same electric potential (for example, about 2.5V) as the plate electric potential VPL of the ferro-electric capacitor CC. CB is wiring capacity generated in the bit lines BL1, and BL2.

FIG. 2 shows a cell distribution diagram showing a bit number (a number of memory cells) on the abscissa and an electric potential of a bit line on the ordinate.

VBL is the distribution of an electric potential (signal amount) of a bit line when "0" is read from the memory cell, and VBH is the distribution of an electric potential (signal amount) of a bit line when "1" is read from the memory cell, and VRef is the distribution of an electric potential (signal amount) of a bit line when the reference electric potential is read from the dummy cell.

The reason that such distributions arise with respect to VBL, VBH, and VRef is that dispersion in manufacturing arises with respect to the dimensions, the thickness, and the like of the cell capacitor (the ferro-electric capacitor or the paraelectric capacitor).

In order to correctly determine "1" and "0" in a sensing operation at the time of reading, for example, it is ideal that the average value of the VRef distribution (the median value between the maximum value and the minimum value of the VRef distribution) is set to the median value (the tip of an arrow 62) between the maximum value of the VBL distribution (the tip of an arrow 61) and the minimum value of the VBH distribution (the tip of an arrow 63) ($\Delta H = \Delta L$).

However, with respect to ferro-electric capacitors in particular, the characteristics thereof greatly vary due to changes in reliability over time, manufacturing dispersion of the dimensions, the thickness, and the like, variations in the operating environment (for example, temperature), and the like. For example, as shown by the broken line of FIG. 2, there are cases in which the VBL distribution is shifted from the ideal position to the VBH side due to these factors.

In this case, a margin between the maximum value of the VBL distribution and the average value of the VRef distribution becomes insufficient, and the probability of a malfunction arising with respect to the "0" reading is high.

Further, if the VRef distribution is made to shift to the VBH side, and a sufficient margin is ensured in order to prevent the malfunction with respect to the "0" reading in this case, a margin between the minimum value of the VBH distribution and the average value of the VRef distribution becomes insufficient. As a result, the probability of a malfunction arising with respect to the "1" reading is high.

As described above, in the prior art, a proposal for a 1T1C type ferro-electric random access memory, which can always ensure a sufficient margin between the electric potential of the bit line corresponding to the read data and the reference electric potential without being affected by changes in reliability over time, manufacturing dispersion of the dimensions, the thickness, and the like, variations in the operating environment, or the like of a ferro-electric capacitor, has been desired.

BRIEF SUMMARY OF THE INVENTION

A ferro-electric random access memory according to an aspect of the present invention comprises a memory cell having a first ferro-electric capacitor, a sense amplifier which determines a data value of the memory cell by using a reference electric potential, and a reference electric potential generating circuit which generates the reference electric potential by using a paraelectric capacitor and a second ferro-electric capacitor.

A ferro-electric random access memory according to an aspect of the present invention comprises a memory cell having a first ferro-electric capacitor, a sense amplifier which determines a data value of the memory cell by using a reference electric potential, a reference electric potential generating circuit which generates the reference electric potential by using a second ferro-electric capacitor, and a trimming circuit which finely adjusts a value of the reference electric potential.

A reading method according to an aspect of the present invention has a series of steps of pre-charging first and second bit lines when data is read from a memory cell having a first ferro-electric capacitor, changing an electric potential of the first bit line in accordance with the value of the data, generating a reference electric potential by using the paraelectric capacitor and the second ferro-electric capacitor, setting an electric potential of the second bit line as a reference electric potential, and determining the value of the data on the basis of a potential difference between the first and second bit lines.

DETAILED DESCRIPTION OF THE INVENTION

Hereinafter, a ferro-electric random access memory relating to embodiments of the present invention will be described in detail with reference to the drawings.

1. Outline

Ferro-electric random access memories relating to embodiments of the present invention relate to a reference electric potential generating circuit which generates a reference electric potential that is the standard in a case of determining a valued of reading data at the time of the reading operation. Namely, the embodiments of the present invention are applied to ferro-electric random access memories requiring a reference electric potential, for example, to a 1T1C type ferro-electric random access memory in which one memory cell is structured from one transistor and one capacitor.

In order to always achieve a stable reading operation at the time of the reading operation, the design of the reference electric potential generating circuit is extremely important. In the embodiments of the present invention, the reference electric potential is generated by the sum of two components: (1) a component by a paraelectric capacitor and (2) a component by a ferro-electric capacitor.

In accordance therewith, a sufficient margin can be always ensured between the electric potential of the bit line corresponding to the read data and the reference electric potential without being affected by changes in reliability over time, manufacturing dispersion of the dimensions, the thickness, and the like, variations in the operating environment, or the like of a ferro-electric capacitor. As a result, a probability of a misreading arising is greatly reduced, and a stable operation can be achieved.

2. First Embodiment

(1) Circuit Example

Figure 3:
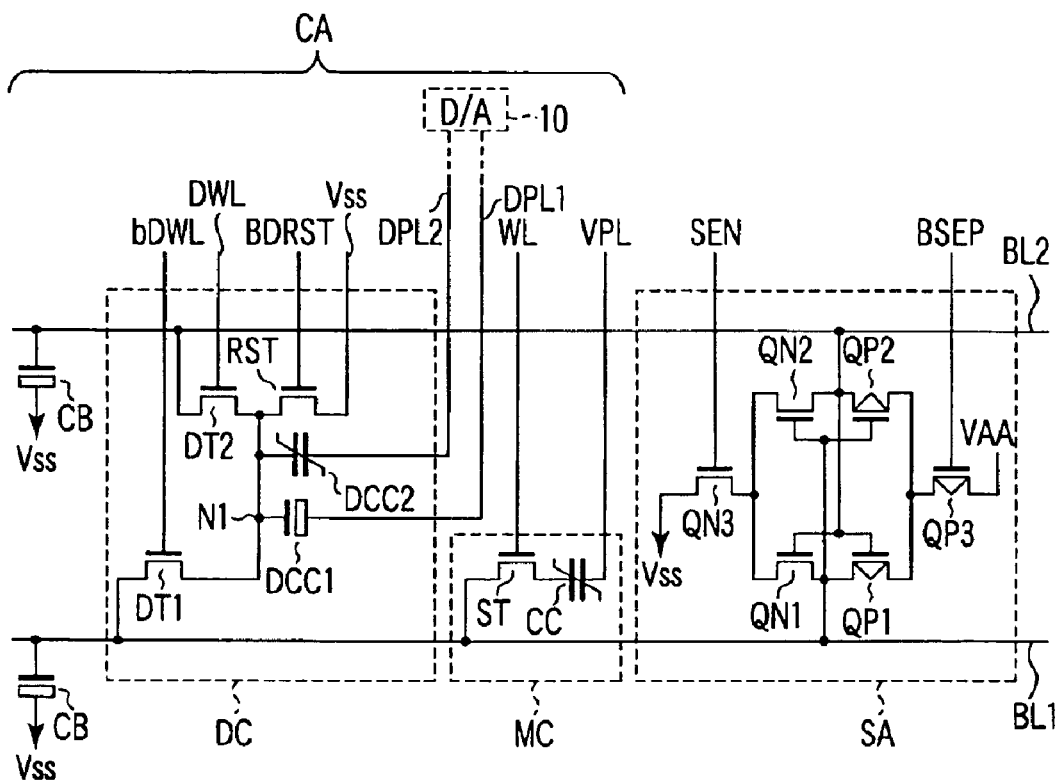
FIG. 3 is a circuit diagram showing a main portion of a ferro-electric random access memory according to a first embodiment of the present invention.

FIG. 3 shows a cell array portion of a 1T1C type ferro-electric random access memory according to a first embodiment of the present invention.

A memory cell MC and a dummy cell DC are disposed in a cell array portion CA.

The memory cell MC is structured from a selective transistor ST and a ferro-electric capacitor CC. The selective transistor ST and the ferro-electric capacitor CC are connected in series. One end of the selective transistor ST is connected to a bit line BL1, and a plate electric potential VPL is supplied to one end of the ferro-electric capacitor CC. A gate of the selective transistor ST is connected to a word line WL.

At the time of the reading operation, when the word line WL is selected, a pressurizing electric potential VPP, for example, about 4V is supplied to the word line WL. The plate electric potential VPL at this time is set to, for example, about 2.5V.

The dummy cell (reference electric potential generating circuit) DC is structured from selective transistors DT1 and DT2, a reset transistor RST, a paraelectric capacitor DCC 1, and a ferro-electric capacitor DCC2. The selective transistor DT1 is connected between the bit line BL1 and a node N1 (one end of the paraelectric capacitor DCC 1 and one end of the ferro-electric capacitor DCC2), and the selective transistor DT2 is connected between the bit line BL2 and the node N1.

The gate of the selective transistor DT1 is connected to a dummy word line bDWL, and the gate of the selective transistor DT2 is connected to a dummy word line DWL. One end of the reset transistor RST is connected to the node N1, and an earthing electric potential Vss is supplied to the other end of the reset transistor RST. The turning-on/turning-off of the reset transistor RST is controlled by a control signal BDRST.

A dummy plate electric potential (driving signal) DPL1 is supplied to the other end of the paraelectric capacitor DCC 1, and a dummy plate electric potential (driving signal) DPL2 is supplied to the other end of the ferro-electric capacitor DCC 2.

Here, for example, when data of the memory cell MC is read at the bit line (selective bit line) BL1, a reference electric potential generated by the dummy cell DC is supplied to the bit line (reference bit line) BL2. Namely, the electric potential of the node N1 is risen to a predetermined value by coupling with dummy plate electric potential DPL1, i.e., an electric potential at the other end of the paraelectric capacitor DCC1, and by coupling with dummy plate electric potential DPL2, i.e., an electric potential at the other end of the ferro-electric capacitor DCC2. Further, the dummy word line DWL becomes "H", and the dummy word line bDWL becomes "L".

Note that the dummy plate electric potentials DPL1 and DPL2 may be different from one another, or may be the same.

Further, the values of the dummy plate electric potentials DPL1 and DPL2 determine the value of the reference electric potential. Accordingly, provided that the values of the dummy plate electric potentials DPL1 and DPL2 can be finely adjusted by using a trimming circuit such as a D/A converter 10 or the like, fine adjustment of the value of the reference electric potential is possible.

A sense amplifier SA is connected between the bit lines BL1 and BL2. The sense amplifier SA has a P channel sense amplifier formed from two P channel MOS transistors QP1 and QP2, and an N channel sense amplifier formed from two N channel MOS transistors QN1 and QN2. The P channel sense amplifier is controlled by a control signal BSEP, and the N channel sense amplifier is controlled by a control signal SEP.

An operating electric potential VAA of the sense amplifier SA is usually set to the same electric potential (for example, about 2.5V) as the plate electric potential VPL of the ferro-electric capacitor CC.

(2) Effects

Figure 4:
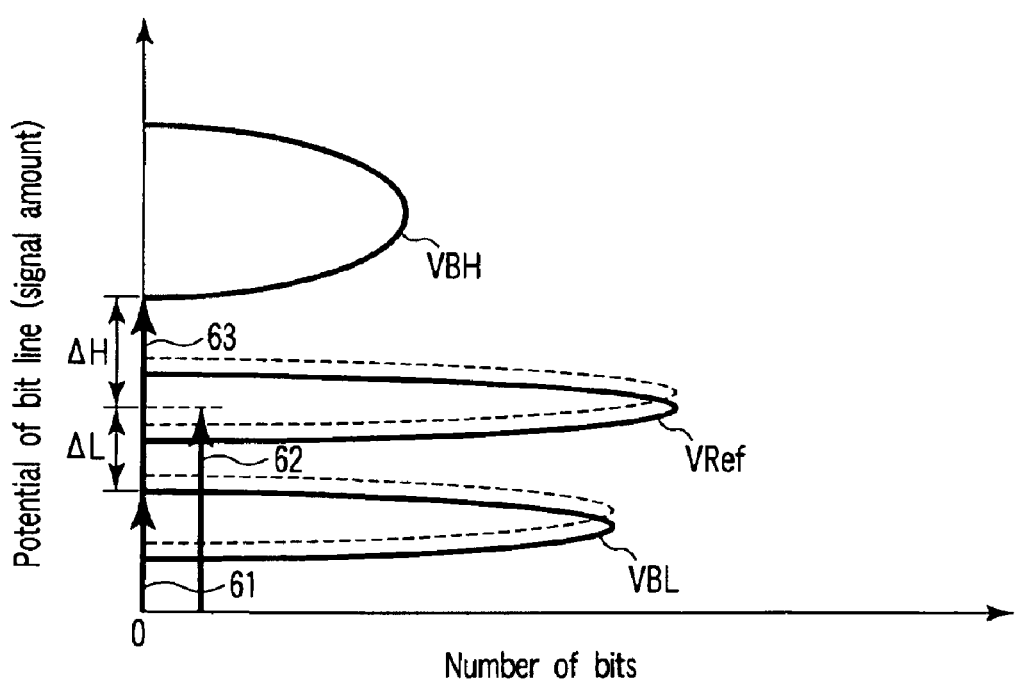
FIG. 4 is a diagram showing the electric potential distribution of a selective bit line and the electric potential distribution of a reference bit line.

FIG. 4 shows a cell distribution diagram showing a bit number (a number of memory cells) on the abscissa and an electric potential of a bit line on the ordinate.

VBL is the distribution of an electric potential (signal amount) of a bit line when "0" is read from the memory cell, and VBH is the distribution of an electric potential (signal amount) of a bit line when "1" is read from the memory cell, and VRef is the distribution of an electric potential (signal amount) of a bit line when the reference electric potential is read from the dummy cell.

Figure 1:
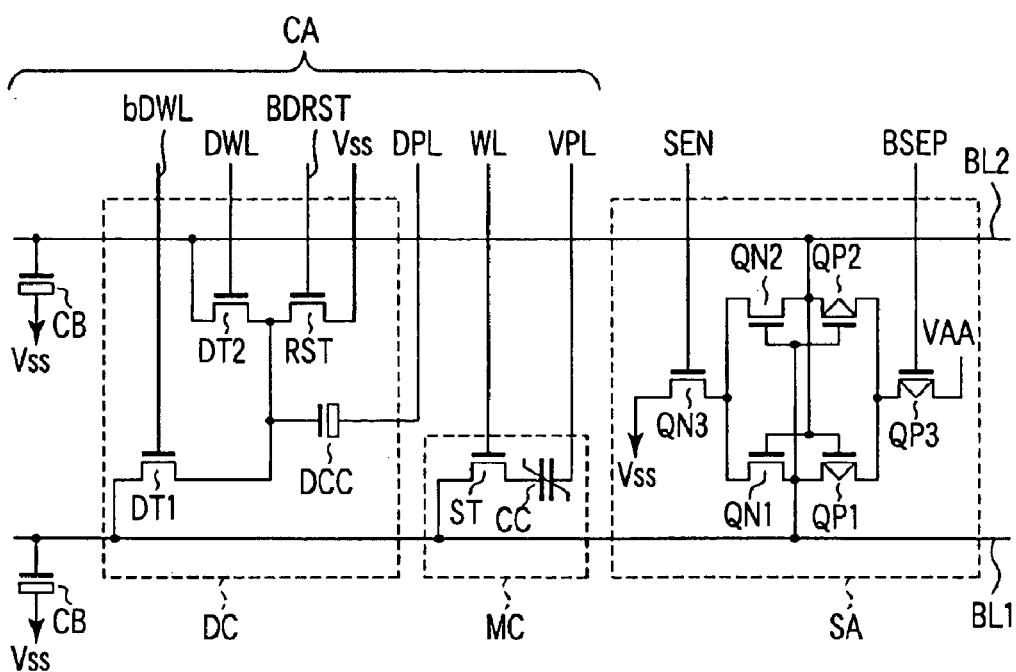
FIG. 1 is a circuit diagram showing a main portion of a conventional ferro-electric random access memory.
Figure 2:
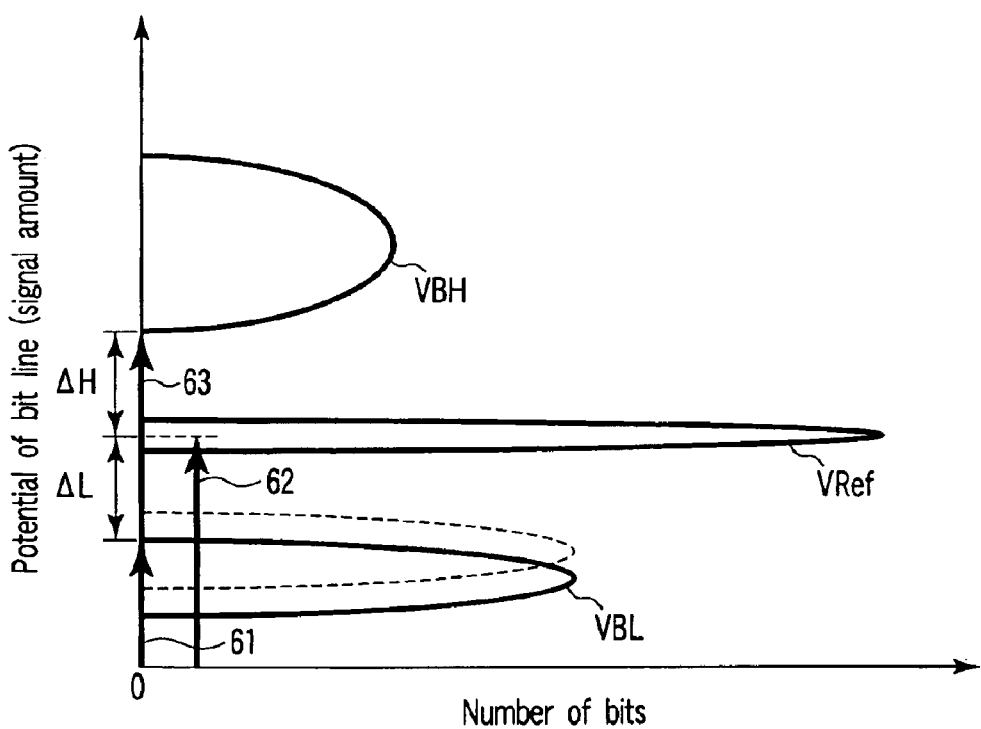
FIG. 2 is a diagram showing the electric potential distribution of a selective bit line and the electric potential distribution of a reference bit line.

Because the reference electric potential VRef is generated by the sum of a component by a paraelectric capacitor and a component by a ferro-electric capacitor, the VRef distribution becomes a distribution in which a distribution by the paraelectric capacitor component (for example, VRef of FIG. 2) and a distribution by the ferro-electric capacitor component (for example, VBL of FIG. 2) are synthesized.

In this case, for example, as shown by the broken lines of FIG. 4, when the VBL distribution varies due to changes in reliability over time, manufacturing dispersion of the dimensions, the thickness, and the like, variations in the operating environment (for example, temperature), and the like of a ferro-electric capacitor, at the same time, the VRef distribution varies in the same way as the variations of the VBL distribution. Therefore, a difference AL between the average value of the VRef distribution (the median value between the maximum value and the minimum value of the VRef distribution) and the maximum value of the VBL distribution (the tip of an arrow 61) does not depend on the variations of the VBL distribution, and is substantially constant.

Accordingly, there is no need to provide a margin based the variations of the VBL distribution between the average value of the VRef distribution and the maximum value of the VBL distribution. This means that the margin ΔL between the average value of the VRef distribution and the maximum value of the VBL distribution can be made narrower, and a margin ΔH between the average value of the VRef distribution and the minimum value of the VBL distribution can be made that much wider.

Namely, according to the embodiment of the present invention, even if variation of the VBL distribution arises, there is no malfunction with respect to the "0" reading, and because the margin ΔH is set to be sufficiently wide, a malfunction with respect to the "1" reading can be eliminated.

In this way, due to the reference electric potential VRef being generated by the sum of a component by a paraelectric capacitor and a component by a ferro-electric capacitor, a sufficient margin can be always ensured between the electric potential of the bit line corresponding to the read data and the reference electric potential, and as a result, a probability of a malfunction arising with respect to both of the "0" reading and the "1" reading can be reduced.

Note that, in the first embodiment, the reference electric potential VRef is generated by the sum of a component by a paraelectric capacitor and a component by a ferro-electric capacitor. However, the reference electric potential VRef may be generated by only the component by the ferro-electric capacitor.

(3) Summary

As described above, in the first embodiment, because the reference electric potential VRef includes the ferro-electric capacitor component, when the VBL distribution varies due to changes in reliability over time, manufacturing dispersion of the dimensions, the thickness, and the like, variations in the operating environment, or the like of a ferro-electric capacitor, the VRef distribution varies as well in the same way.

Accordingly, the margin ΔL with respect to the "0" reading can be made narrow, and a margin with respect to the "1" reading can be made wide. In accordance therewith, the probability of a malfunction arising with respect to both of the "0" reading and the "1" reading can be reduced, and a stable operation can be achieved.

3. Second Embodiment (1) Circuit Example

Figure 5:
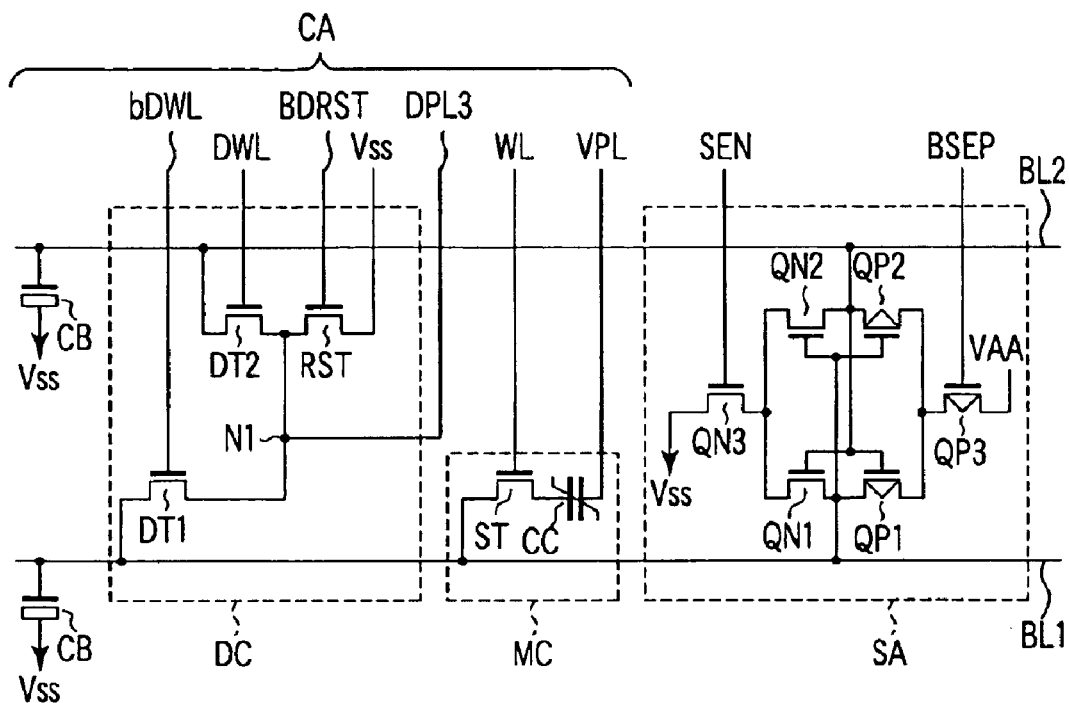
FIG. 5 is a circuit diagram showing a main portion of a ferro-electric random access memory according to a second embodiment of the present invention.

FIG. 5 shows a cell array portion of a 1T1C type ferro-electric random access memory according to a second embodiment of the present invention.

The feature of this circuit example is that a capacitor for generating the reference electric potential does not exist in the dummy cell DC provided for every two bit lines, and instead, the reference electric potential generating circuit for supplying a reference electric potential DPL3 is commonly provided for a plurality of or all of the dummy cells DC in the memory cell array.

The memory cell MC and the dummy cell DC are disposed in a cell array portion CA.

The memory cell MC is structured from the selective transistor ST and the ferro-electric capacitor CC. The selective transistor ST and the ferro-electric capacitor CC are connected in series. One end of the selective transistor ST is connected to the bit line BL1, and the plate electric potential VPL is supplied to one end of the ferro-electric capacitor CC. The gate of the selective transistor ST is connected to the word line WL.

The dummy cell DC is structured from the selective transistors DT1 and DT2, and the reset transistor RST. The selective transistor DT1 is connected between the bit line BL1 and the node N1, and the selective transistor DT2 is connected between the bit line BL2 and the node N1.

The gate of the selective transistor DT1 is connected to the dummy word line bDWL, and the gate of the selective transistor DT2 is connected to the dummy word line DWL. One end of the reset transistor RST is connected to the node N1, and an earthing electric potential Vss is supplied to the other end of the reset transistor RST. The turning-on/turning-off of the reset transistor RST is controlled by a control signal BDRST.

The reference electric potential DPL3 is supplied to the node N1. The reference electric potential DPL3 is generated by a reference electric potential generating circuit provided at the peripheral portion of the memory cell array. Only one reference electric potential generating circuit may be provided in a memory chip, and a plurality of reference electric potential generating circuits may be provided in the memory chip.

The sense amplifier SA is connected between the bit lines BL1 and BL2. The sense amplifier SA has a P channel sense amplifier formed from two P channel MOS transistors QP1 and QP2, and an N channel sense amplifier formed from two N channel MOS transistors QN1 and QN2. The P channel sense amplifier is controlled by a control signal BSEP, and the N channel sense amplifier is controlled by a control signal SEP.

An operating electric potential VAA of the sense amplifier SA is usually set to the same electric potential (for example, about 2.5V) as the plate electric potential VPL of the ferro-electric capacitor CC.

(2) Reference Electric Potential Generating Circuit

Figure 6:
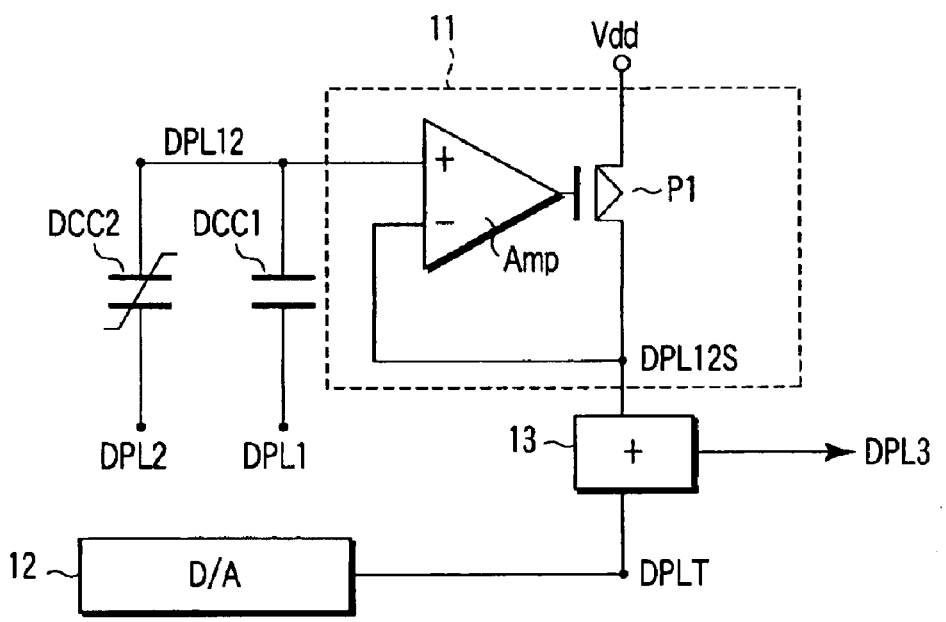
FIG. 6 is a circuit diagram showing an example of a reference electric potential generating circuit which generates a reference electric potential of FIG. 5.

FIG. 6 shows a circuit example of a reference electric potential generating circuit which generates the reference electric potential DPL3 in FIG. 5.

At least one reference electric potential generating circuit is provided at the peripheral portion of the memory cell array as described above.

One end of the paraelectric capacitor DCC1 and one end of the ferro-electric capacitor DCC2 are electrically connected to one another. The dummy plate electric potential (driving signal) DPL1 is supplied to the other end of the paraelectric capacitor DCC 1, and the dummy plate electric potential (driving signal) DPL2 is supplied to the other end of the ferro-electric capacitor DCC 2.

An electric potential DPL12 at the one ends of the paraelectric capacitor DCC1 and the ferro-electric capacitor DCC2 is the sum of a coupling component by the dummy plate electric potential DPL1 (the paraelectric capacitor component) and a coupling component by the dummy plate electric potential DPL2 (the ferro-electric capacitor component).

DPL12 is inputted to a voltage follower circuit 11. The voltage follower circuit 11 is structured from a differential amplifier Amp and the P channel MOS transistor P1, and has the function of generating DPL12S which is the same electric potential as DPL12 on the basis of DPL12.

Namely, the differential amplifier Amp in the voltage follower circuit 11 controls a gate electric potential of the P channel MOS transistor P1 such that DPL12S is made equal to DPL12.

In this way, the reason that DPL12S is generated by the voltage follower circuit 11 is that DPL12 is an electric potential generated by coupling phenomena, and does not have driving force of load by electric current (electric current driving force), i.e., concretely, an electric charge amount which can fully satisfy a parasitic capacity generated at the bit line in order for the bit line to be a predetermined electric potential.

Then, in the present embodiment, DPL12S which is the same electric potential as DPL12, and which has electric current driving force is generated by using the voltage follower circuit 11.

A D/A converter 12 is a trimming circuit for finely adjusting (trimming) the value of the dummy plate electric potential DPL3, and generates an electric potential DPLT for fine-adjustment. An adder 13 adds DPL12S and DPLT, supplies DPL3 as the reference electric potential to a plurality of or all of the dummy cells DC in the memory cell array.

Here, for example, when the data of the memory cell MC is read at the bit line BL1 of FIG. 5, first, the bit lines BL1 and BL2 are pre-charged and equalized, and the electric potentials of the bit lines BL1 and BL2 are set to predetermined values. Thereafter, the bit line BL2 is set to reference electric potential DPL3 generated by the reference electric potential generating circuit of FIG. 6, and the electric potential of the bit line BL1 varies in accordance with a value of the data stored in the memory cell MC.

Further, a potential difference generated between the bit lines BL1 and BL2 is made large by the sense amplifier SA, and the data value of the memory cell MC is determined.

Note that reference electric potential DPL3 is formed from by the paraelectric capacitor component, the ferro-electric capacitor component, and the trimming component. Here, the paraelectric capacitor component and the trimming component can be put together. For example, the paraelectric capacitor DCC1 of FIG. 6 may be omitted, and the paraelectric capacitor component and the trimming component may be generated by the D/A converter 12.

The dummy plate electric potentials DPL1 and DPL2 may be different from one another, or may be the same.

(2) Summary

In this way, in the second embodiment as well, the reference electric potential DPL3 includes the ferro-electric capacitor component. Accordingly, in the same way as in the first embodiment, the probability of a malfunction arising with respect to both of the "0" reading and the "1" reading can be reduced, and a stable operation can be achieved, without being affected by changes in reliability over time, manufacturing dispersion of the dimensions, the thickness, and the like, variations in the operating environment, or the like of a ferro-electric capacitor.

As described above, in accordance with the ferro-electric random access memory relating to the examples of the present invention, the 1T1C type ferro-electric random access memory which can always ensure a sufficient margin between the electric potential of the bit line corresponding to the read data and the reference electric potential without being affected by changes in reliability over time, manufacturing dispersion of the dimensions, the thickness, and the like, variations in the operating environment, or the like of a ferro-electric capacitor, can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A ferro-electric random access memory comprising:
   a memory cell having a first ferro-electric capacitor;
   a sense amplifier which determines a data value of the memory cell by using a reference electric potential; and
   a reference electric potential generating circuit which generates the reference electric potential by using a paraelectric capacitor and a second ferro-electric capacitor;
   wherein one end of the paraelectric capacitor and one end of the second ferro-electric capacitor are connected to a common node, a first driving signal is supplied to the other end of the paraelectric capacitor, and a second driving signal is supplied to the other end of the second ferro-electric capacitor.

2. The ferro-electric random access memory according to claim 1, further comprising:
   bit lines; and
   selective transistors connected between the bit lines and the common node.

3. The ferro-electric random access memory according to claim 1, further comprising:
   a trimming circuit to finely adjust values of the first and second driving signals.

4. The ferro-electric random access memory according to claim 1, wherein the reference electric potential generating circuit is disposed in the memory cell array.

5. The ferro-electric random access memory according to claim 1, wherein the reference electric potential generating circuit is disposed at the peripheral portion of the memory cell array.

6. The ferro-electric random access memory according to claim 1, further comprising:
   a voltage follower circuit which generates a first electric potential on the basis of an electric potential of the common node.

7. The ferro-electric random access memory according to claim 6, further comprising:
   a trimming circuit which generates a second electric potential that finely adjusts a value of the reference electric potential; and
   an adder which adds the first and second electric potentials.

8. A ferro-electric random access memory comprising:
   a memory cell having a first ferro-electric capacitor;
   a sense amplifier which determines a data value of the memory cell by using a reference electric potential;
   a reference electric potential generating circuit which generates the reference electric potential by using a second ferro-electric capacitor; and
   a trimming circuit which outputs an output electric potential that finely adjusts the value of the reference electric potential;
   wherein one end of the second ferro-electric capacitor is connected to a common node, and a driving signal is supplied to the other end of the second ferro-electric capacitor.

9. The ferro-electric random access memory according to claim 8, further comprising:
   bit lines; and
   selective transistors connected between the bit lines and the common node.

10. The ferro-electric random access memory according to claim 8, wherein the trimming circuit finely adjusts the value of the reference electric potential based on a signal that is generated by a paraelectric capacitor.

11. The ferro-electric random access memory according to claim 8, wherein the reference electric potential generating circuit is disposed in the memory cell array.

12. The ferro-electric random access memory according to claim 8, wherein the reference electric potential generating circuit is disposed at the peripheral portion of the memory cell array.

13. The ferro-electric random access memory according to claim 8, further comprising:
   a voltage follower circuit which outputs an output electric potential on the basis of an electric potential of the common node.

14. The ferro-electric random access memory according to claim 13, further comprising:
   an adder which adds the output electric potential of the trimming circuit and the output electric potential of the voltage follower circuit.

15. A read method of a ferro-electric random access memory, comprising:
   pre-charging first and second bit lines when data is read from a memory cell having a first ferro-electric capacitor;
   changing an electric potential of the first bit line in accordance with a value of the data;

generating a reference electric potential by using a paraelectric capacitor and a second ferroelectric capacitor;

setting an electric potential of the second bit line to the reference electric potential; and determining the value of the data on the basis of a potential difference between the first and the second bit lines;

wherein the reference electric potential is generated due to a first driving signal being supplied to the other end of the paraelectric capacitor, and a second driving signal being supplied to the other end of the second ferroelectric capacitor;

wherein values of the first and second driving signals are finely adjusted by a trimming circuit.

16. The read method according to claim 15, wherein the reference electric potential is supplied to a voltage follower circuit.

17. The read method according to claim 16, wherein the value of the reference electric potential is finely adjusted by the trimming circuit.

* * * * *